(12) United States Patent
Midya et al.

(10) Patent No.: US 7,130,346 B2
(45) Date of Patent: Oct. 31, 2006

(54) METHOD AND APPARATUS HAVING A DIGITAL PWM SIGNAL GENERATOR WITH INTEGRAL NOISE SHAPING

(75) Inventors: Pallab Midya, Palatine, IL (US); Jing Fang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 60 days.

(21) Appl. No.: 10/845,949

(22) Filed: May 14, 2004

(65) Prior Publication Data

US 2005/0254573 A1    Nov. 17, 2005

(51) Int. Cl.
*H03K 7/08*    (2006.01)
(52) U.S. Cl. ....................... 375/238; 332/109
(58) Field of Classification Search ................ 375/238, 375/242, 285, 239; 370/205, 212; 327/172, 327/175, 176; 341/53; 332/109, 112
See application file for complete search history.

(56) References Cited

U.S. PATENT DOCUMENTS

| 5,077,539 | A | 12/1991 | Howatt |
| 5,933,453 | A * | 8/1999 | Lewison ..................... 375/238 |
| 6,414,613 | B1 | 7/2002 | Midya et al. |
| 6,515,604 | B1 | 2/2003 | Delano |
| 6,545,533 | B1 | 4/2003 | Karki et al. |
| 6,549,085 | B1 | 4/2003 | Wagh et al. |
| 6,580,322 | B1 | 6/2003 | Miao et al. |
| 6,587,010 | B1 | 7/2003 | Wagh et al. |
| 6,594,309 | B1 | 7/2003 | Botti et al. |
| 6,605,991 | B1 | 8/2003 | Midya et al. |
| 6,606,044 | B1 | 8/2003 | Roeckner et al. |
| 2003/0042868 | A1* | 3/2003 | Muramatsu .................. 320/107 |
| 2003/0122692 | A1* | 7/2003 | Roeckner et al. .............. 341/53 |
| 2004/0062303 | A1* | 4/2004 | Midya et al. ................ 375/238 |
| 2004/0239417 | A1* | 12/2004 | Kowkutla et al. ............ 330/10 |

OTHER PUBLICATIONS

Yoneya, A. and Watanabe, A., "Low Distortion Digital Pulse Width Modulation fir Audio Class-D Amplifier," Communications and Information Technology, 2004, ISCIT, IEEE International Symposium on, vol.1, Oct. 26-29, 2004, pp. 515-518.*

* cited by examiner

*Primary Examiner*—Kevin Kim
(74) *Attorney, Agent, or Firm*—Michael J. Balconi-Lami

(57) ABSTRACT

A method and apparatus having a digital pulse width modulation generator with integral noise shaping is provided. The apparatus for generating a digital pulse width modulation signal includes a random period signal generator, a noise shaping unit, a duty ratio quantizer, and a PWM counter. The random period signal generator generates a random period signal. The noise shaping unit is responsive to at least a digital signal, the random period signal, and a delayed digital signal for generating a corrected signal. The duty ratio quantizer is responsive to the corrected digital signal, the random period signal, and a quantization clock signal, and generates a first duty ratio signal and a second duty ratio signal. The PWM counter is responsive to the first and second duty ratio signals and a quantization clock signal, and generates positive and negative PWM signals, respectively.

31 Claims, 6 Drawing Sheets

METHOD AND APPARATUS HAVING A DIGITAL PWM SIGNAL GENERATOR WITH INTEGRAL NOISE SHAPING

FIELD OF THE INVENTION

The present invention relates to digital amplifiers, and more specifically, to interference and noise reduction of pulse width modulation (PWM) signals.

RELATED ART

In digital audio amplifiers, pulse width modulation (PWM) is often used to transform a digital signal into its analog component. Digital audio amplifiers of the sort are often referred to as digital PWM audio amplifiers. Digital PWM audio amplifiers can be used in a variety of applications, such as, for example, cellular phones and high-end digital audio equipment.

Many digital PWM audio amplifiers conform to a special class of amplifiers known as class D digital amplifiers. In typical class D digital amplifiers, a fixed frequency signal generator, such as a triangle oscillator, is used in conjunction with the digital audio input to perform pulse width modulation. The pulse width modulated signals are amplified and provided to a low pass filter to reduce electromagnetic interference (EMI). Although using a low pass filter is a viable way of removing EMI interference, it also warrants the use of additional board space and adds additional cost to the digital audio amplifier. In many low-end cellular phone applications, increasing unit costs is not a viable option, thus, alternative methods that can be used to reduce costs while improving signal quality are often considered exemplary.

Therefore, the need exists for an improved digital amplifier that reduces EMI and quantization noise in a digital amplifier.

BRIEF DESCRIPTION OF THE DRAWINGS

The present invention is illustrated by way of example and not limited by the accompanying figures, in which like references indicate similar elements, and in which.

Figure 1:
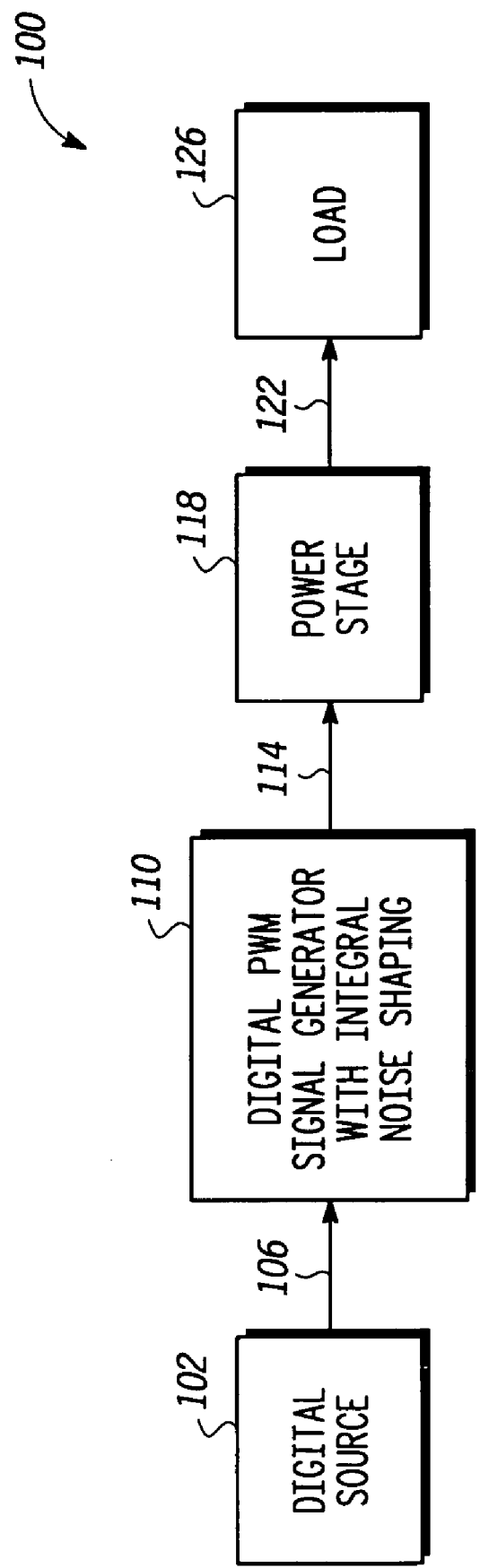
FIG. 1 illustrates, in block diagram form, a PWM digital amplifier in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one embodiment of the present invention, a digital amplifier apparatus includes a digital pulse width modulation (PWM) signal generator with integral noise shaping for generating a digital PWM signal and a power stage. The PWM signal generator is responsive to a digital signal input and a random period signal for re-distributing a quantization noise of a corrected digital signal input to a band outside an audio band of interest in generating the digital PWM signal. The power stage is responsive to the digital PWM signal for providing an amplified digital PWM signal.

In one embodiment of the present invention, an apparatus for generating a digital pulse width modulation (PWM) signal includes a random period signal generator, a noise shaping unit, a duty ratio quantizer, and a PWM counter. The random period signal generator generates a random period signal. The noise shaping unit is responsive to at least a digital signal, the random period signal, and a delayed digital signal for generating a corrected signal. The duty ratio quantizer is responsive to the corrected digital signal, the random period signal, and a quantization clock signal, and generates a first duty ratio signal and a second duty ratio signal. The PWM counter is responsive to the first and second duty ratio signals and a quantization clock signal, and generates positive and negative PWM signals, respectively.

In one embodiment of the present invention, a method is provided for digital pulse width modulation (PWM) signal generation. A digital signal is received. A random period signal is generated using a random period generator, the random period signal including a left half-cycle and a right half-cycle. Adaptive coefficients are calculated based on the random period. A first generator is used to calculate first functions for the left half-cycle of the random period. A second generator is used to calculate second functions for the left half-cycle of the random period. An error signal is estimated using the second functions for the left-half cycle. The received digital signal is summed with the estimated error signal for the left half-cycle. The first and second duty ratios are quantized for the left half-cycle to establish a quantization clock count for the left half-cycle of positive and negative PWM signals. The first generator is used to calculate first functions for the right half-cycle of the random period. The second generator is used to calculate second functions for the right half-cycle of the random period. The error signal is estimated using the second functions for the right half-cycle. The received digital signal is summed with the estimated error signal for the right half-cycle. The first and second duty ratios are quantized for the right half-cycle to establish a quantization clock count for the right half-cycle of positive and negative PWM signals.

FIG. 1 illustrates digital amplifier 100 in accordance with one embodiment of the present invention. Digital amplifier 100 includes a digital source 102, a digital pulse width modulation signal generator with integral noise shaping (DPSG) 110, a power stage 118, and a load 126. Digital source 102 may include such devices as a CD player, digital audio tape player, cell phone, digital car radio, etc. In one embodiment, load 126 may be an audio speaker. Other embodiments of the present invention may use other types of loads.

In operation, digital source 102 provides a digital signal 106 to DPSG 110. Digital signal 106 may be digital input in the form of, for example, a pulse code modulated (PCM) signal or a pulse density modulated (PDM) signal. DPSG 110 receives digital signal 106 and utilizes a random period generator to reduce electromagnetic interference (EMI) and uses integral noise shaping to reduce the amount of quantization noise caused by quantization. DPSG 110 provides digital PWM signals 114 to power stage 118 for amplification. Power stage 118 amplifies digital PWM signals 114 and provides the amplified PWM signals 122 as audio output to load 126.

Figure 2:
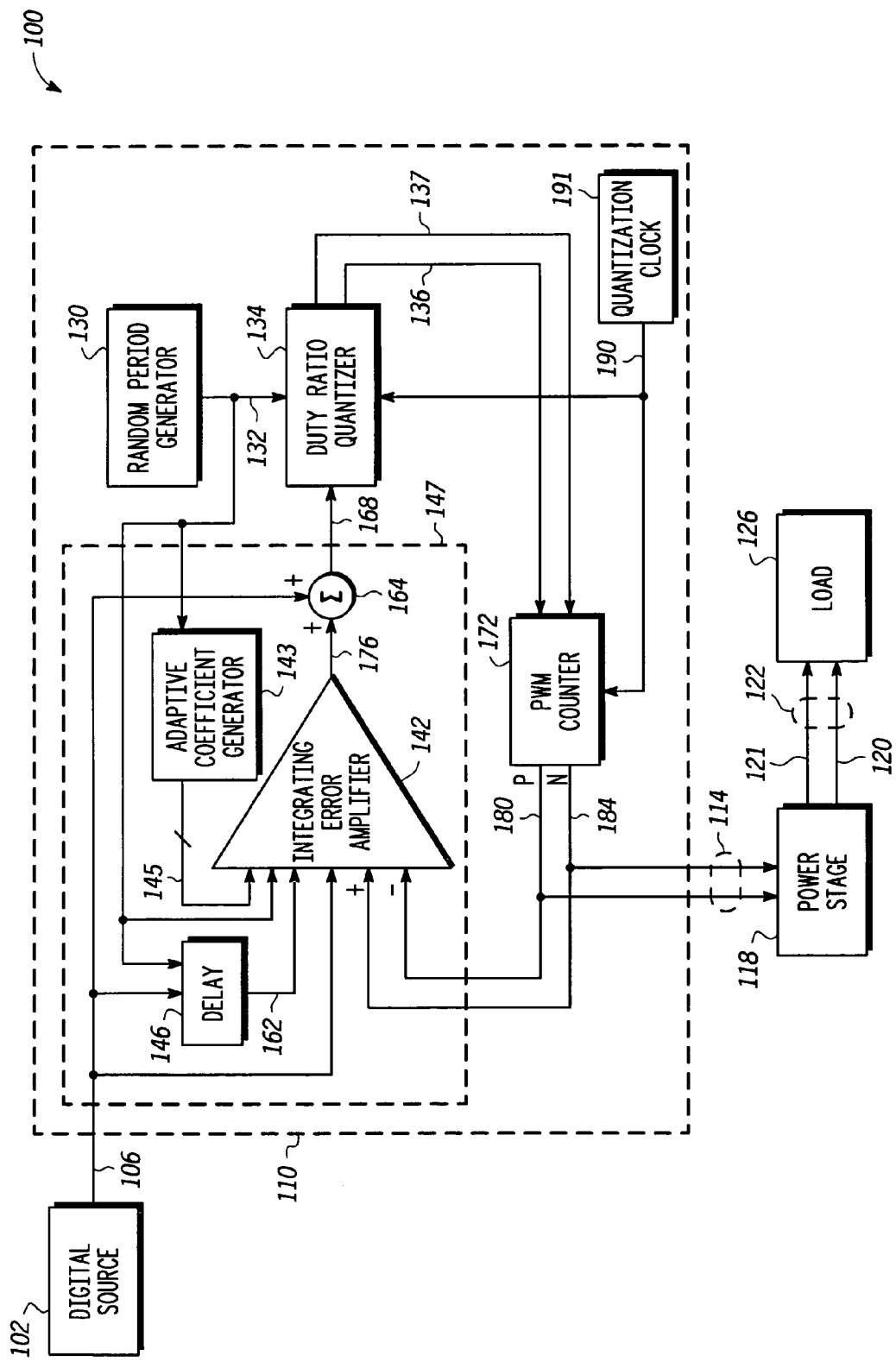
FIG. 2 illustrates, in block diagram form, a PWM digital amplifier in accordance with one embodiment of the present invention.

FIG. 2 illustrates digital amplifier 100 in accordance with one embodiment of the present invention. DPSG 110 of digital amplifier 100 includes a noise shaping unit 147, a random period generator 130, a duty ratio quantizer 134, and a pulse width modulation (PWM) counter 172. Noise shaping unit 147 includes a delay block 146, an integrating error amplifier 142, a summer 164, and an adaptive coefficient generator 143.

In operation, DPSG 110 receives digital signal 106 from digital source 102. Digital signal 106 is provided to delay block 146, summer 164, and integrating error amplifier 142 of noise shaping unit 147. In one embodiment, delay block 146 receives digital signal 106 and delays digital signal 106 by a delay amount limited by the duration of a random period signal 132 (random period 132) generated by random period generator 130. In one embodiment, random period signal 132 may include an independently variable frequency signal and may vary on a cycle-by-cycle basis. The delay amount is normalized in integrating error amplifier 142 using half of random period 132 (random half-period 132). The normalized delay amount may be referred to as a delay ratio. The delayed digital signal 162 is provided to integrating error amplifier 142.

In addition to providing random period 132 to delay block 146, random period generator 130 provides random period 132 to duty ratio quantizer 134, integrating error amplifier 142, and adaptive coefficient generator 143. Adaptive coefficient generator 143 uses random period 132 to generate adaptive coefficients 145. Adaptive coefficients 145 are then provided to integrating error amplifier 142.

Integrating error amplifier 142 of noise shaping unit 147 receives random period 132, delayed digital signal 162 from delay block 146, digital signal 106 from digital source 102, adaptive coefficients 145 from adaptive coefficient generator 143, PWM signal 184 from PWM counter 172, and PWM signal 180 from PWM counter 172. Integrating error amplifier 142 performs a series of noise shaping operations (further described in the description of FIG. 3) to generate error signal (estimated error) 176. Estimated error 176 represents the noise shaped error between delayed digital signal 162 and the PWM signal difference (i.e., the difference between PWM signal 180 and PWM signal 184). In one embodiment, the error between delayed digital signal 162 and the PWM signal difference is noise shaped by the integral portion of integrating error amplifier 142 using adaptive coefficients 145 and digital signal 106. In one embodiment, the duty ratios corresponding to duty ratio 136 and duty ratio 137 may be derived by integrating error amplifier 142 using PWM signal 180 and PWM signal 184. In an alternate embodiment, duty ratio 136 and duty ratio 137 may be provided directly to integrating error amplifier 142 (not shown). Summer 164 receives estimated error 176 and digital signal 106 and performs a summation operation to generate corrected digital signal 168. Corrected digital signal 168 is provided to duty ratio quantizer 134 along with random period 132 and quantization clock signal 190.

Duty ratio quantizer 134 receives corrected digital signal 168 from summer 164, random period 132 from random period generator 130, and quantization clock signal 190 from quantization clock 191 and generates duty ratio 136 and duty ratio 137. In one embodiment, duty ratio 136 and duty ratio 137 are calculated for both the left half of the cycle (left half-cycle) of random period 132 and the right half of the cycle (right half-cycle) of random period 132. In one embodiment, duty ratio quantizer 134 uses the duration of a predicted quantized version of PWM signal 180 (corresponding to corrected digital signal 168 for the left half-cycle of random period 132) and the random half-period (half of random period 132 corresponding to the left half-cycle) to generate duty ratio 137. Similarly, duty ratio quantizer 134 uses the duration of a predicted quantized version of PWM signal 184 (corresponding to corrected digital signal 168 for the left half-cycle of random period 132) and the random half-period (half of random period 132 corresponding to the left half-cycle) to generate duty ratio 136. For the right half-cycle, duty ratio quantizer 134 uses the duration of a predicted quantized version of PWM signal 180 (corresponding to corrected digital signal 168 for the right half-cycle of random period 132) and the random half-period (half of random period 132 corresponding to the right half-cycle) to generate duty ratio 137. Similarly, duty ratio quantizer 134 uses the duration of a predicted quantized version of PWM signal 184 (corresponding to corrected digital signal 168 for the right half-cycle of random period 132) and the random half-period (half of random period 132 corresponding to the right half-cycle) to generate duty ratio 136.

In one embodiment, the quantization noise caused by, for example, duty ratio quantizer 134 is re-distributed by noise shaping unit 147 outside of the audio band of interest such that a desired signal-to-noise ratio criteria is met at the output of power stage 118. In one embodiment, such as for CD quality audio, the desired signal-to-noise ratio criteria may be 96 dB. Alternate embodiments may have alternate signal-to-noise criteria of which noise shaping unit 147 may be adjusted accordingly.

PWM counter 172 receives duty ratio 136 from duty ratio quantizer 134, duty ratio 137 from duty ratio quantizer 134, and quantization clock signal 190 from quantization clock 191 and generates PWM signal 180 and PWM signal 184. In one embodiment, PWM signal 180 is generated by counting the number of quantization clock cycles represented by duty ratio 137 and PWM signal 184 is generated by counting the number of quantization clock cycles represented by duty ratio 136. PWM signal 180 and PWM signal 184, both of which are in the form of square waves, are provided to integrating error amplifier 142 and power stage 118. Power stage 118 amplifies PWM signal 180 and PWM signal 184 to produce amplified PWM signal 120 and amplified PWM signal 121. Amplified PWM signal 120 and amplified PWM signal 121 are provided to load 126 and represent the audio output of digital amplifier 100.

Figure 3:
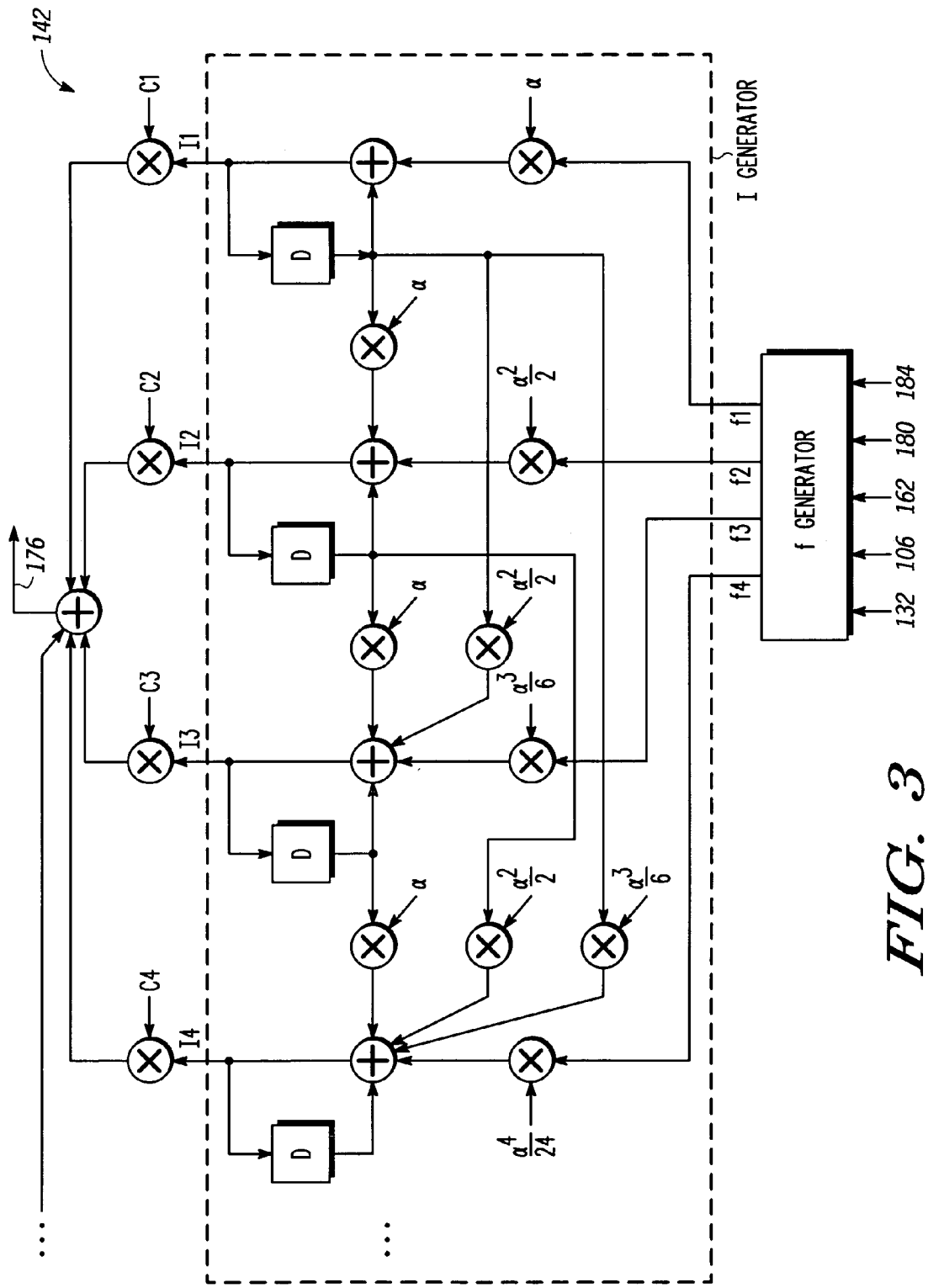
FIG. 3 illustrates, in block diagram form, an integrating error amplifier in accordance with one embodiment of the present invention.

FIG. 3 depicts integrating error amplifier 142 according to one embodiment of the present invention. In one embodiment, estimated error 176 is generated using equations 1–15 corresponding to the block diagram shown in FIG. 3. Estimated error 176 is calculated for both the left half-cycle and the right half-cycle of the random period 132 generated by random period generator 130. The f generator generates f functions $f1, f2, f3, f4$ for the left-half cycle and the right half-cycle and the I generator generates I functions I1, I2, I3, I4 for the left half-cycle and the right half-cycle.

A mathematical description of one embodiment of the present invention will be given using the following variables:
Half cycle index k
Cycle index n
Nominal half-period $T_o[n]$
Random half-period, $T[n]$
Gain constants, C1, C2, C3, C4
Delayed digital signal 162 for the left half-cycle, xl[n−1]
Delayed digital signal 162 for the right half-cycle, xr[n−1]
Digital signal 106 for the left half-cycle, xl[n]
Digital signal 106 for the right half-cycle, xr[n]
Delay ratio for the left half-cycle, dl[n]
Delay ratio for the right half-cycle, dr[n]
Duty ratio of PWM signal 180 for the left half-cycle, $dl_1[n]$
Duty ratio of PWM signal 180 for the right half-cycle, $dr_1[n]$
Duty ratio of PWM signal 184 for the left half-cycle, $dl_2[n]$
Duty ratio of PWM signal 184 for the right half-cycle, $dr_2[n]$
Cycle index n may be calculated using equation 1:

Eq. 1: $n = \dfrac{k+1}{2}$ for the left half-cycle or $n = \dfrac{k}{2}$ for the right half-cycle Adaptive coefficients 145 may be calculated using equation 2:

Eq. 2: $\alpha[n] = \dfrac{T[n]}{T_0[n]}$

The f-functions $f1, f2, f3, f4$ for the left half-cycle may be calculated using equations 3–6:

$f1 = xr[n-1] + (xl[n] - xr[n-1])dl[n] + (1 - dl_1[n]) - (1 - dl_2[n])$  Eq. 3:

$f2 = xr[n-1] + (xl[n] - xr[n-1])dl^2[n] + (1 - dl_1[n])^2 - (1 - dl_2[n])^2$  Eq. 4:

$f3 = xr[n-1] + (xl[n] - xr[n-1])dl^3[n] + (1 - dl_1[n])^3 - (1 - dl_2[n])^3$  Eq. 5:

$f4 = xr[n-1] + (xl[n] - xr[n-1])dl^4[n] + (1 - dl_1[n])^4 - (1 - dl_2[n])^4$  Eq. 6:

The f-functions $f1, f2, f3, f4$ for the right half-cycle may be calculated using equations 7–10:

$f1 = xl[n] + (xr[n] - xl[n-1])dr[n] + dr_2[n] - dr_1[n]$  Eq. 7:

$f2 = xl[n] + (xr[n] - xl[n-1])dr^2[n] + dr_2^2[n] - dr_1^2[n]$  Eq. 8:

$f3 = xl[n] + (xr[n] - xl[n-1])dr^3[n] + dr_2^3[n] - dr_1^3[n]$  Eq. 9:

$f4 = xl[n] + (xr[n] - xl[n-1])dr^4[n] + dr_2^4[n] - dr_1^4[n]$  Eq. 10:

The I functions I1, I2, I3, I4 for both the left half-cycle and the right half-cycle may be calculated using equations 11–14:

Eq. 11:
$I1[k] = I1[k-1] + (\alpha)(f1)$

Figure 4:
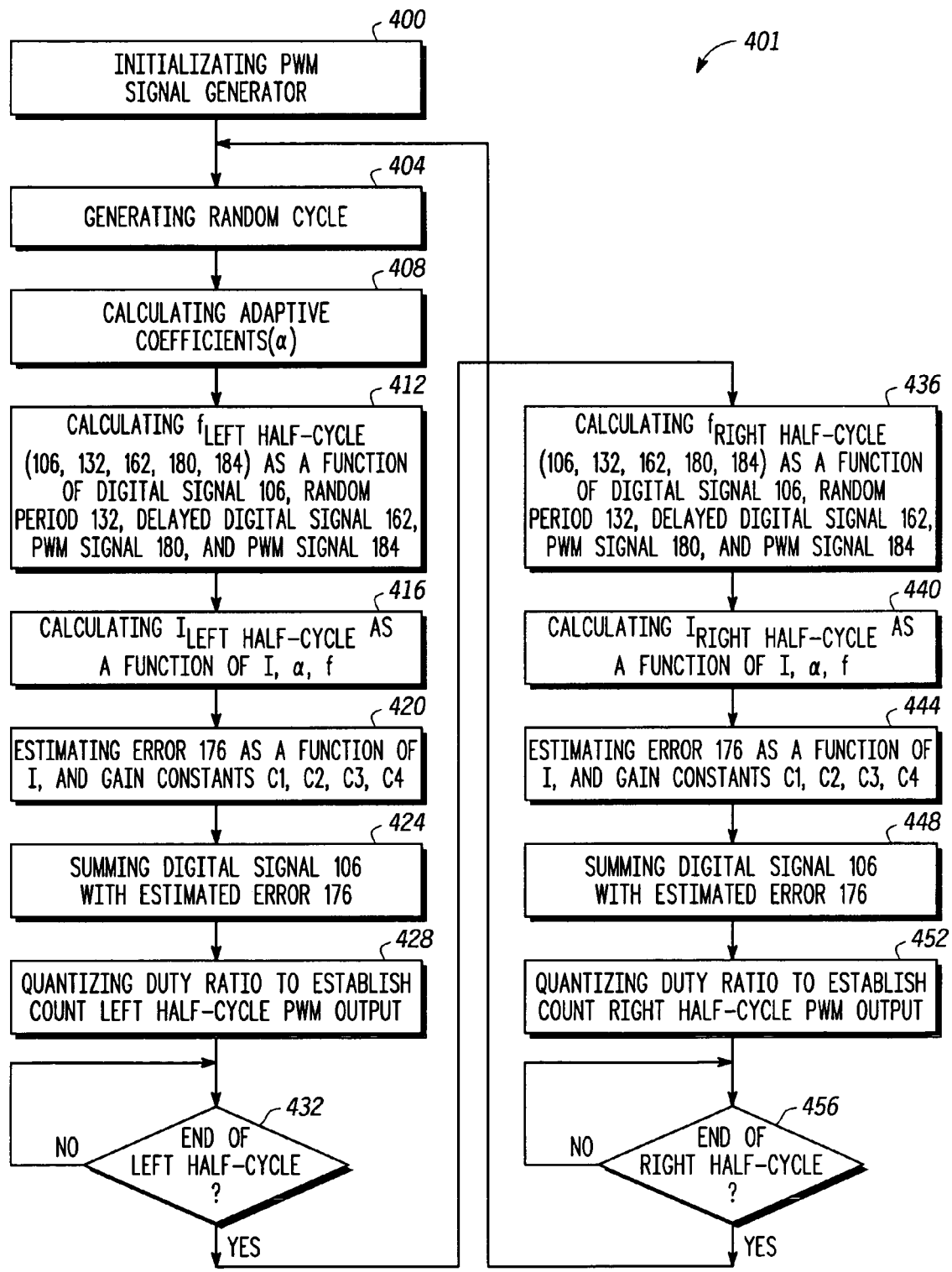
FIG. 4 illustrates, in flow diagram form, a method used in one embodiment of the present invention.

Eq. 12:
$I2[k] = I2[k-1] + (\alpha)(I1[k-1]) + \left(\dfrac{\alpha^2}{2}\right)(f2)$ Eq. 13:
$I3[k] = I3[k-1] + (\alpha)(I2[k-1]) + \left(\dfrac{\alpha^2}{2}\right)(I1[k-1]) + \left(\dfrac{\alpha^3}{6}\right)(f3)$ Eq. 14:
$I4[k] = I4[k-1] + (\alpha)(I3[k-1]) + \left(\dfrac{\alpha^2}{2}\right)(I2[k-1]) + \left(\dfrac{\alpha^3}{6}\right)(I1[k-1]) + \left(\dfrac{\alpha^4}{24}\right)(f4)$ Estimated error 176 may be calculated using equation 15:

$e[k] = (C1)I1[k] + (C2)I2[k] + (C3)I3[k] + (C4)I4[k]$  Eq. 15:

FIG. 4 illustrates, in flow chart form, the functionality carried out by one embodiment of the present invention. In one embodiment, flow 401 begins with the initialization of DPSG 110. Flow 401 then proceeds to step 404, where a random period is generated by random period generator 130. Flow 401 then continues to step 408, where adaptive coefficients are calculated based on the random period. Flow 401 then proceeds to step 412, where f generator calculates $f$ functions $f1, f2, f3, f4$ for the left half-cycle of the random period generated by random period generator 130. The $f$ functions (shown in equations 3–6), are functions of digital signal 106, random period 132, delayed digital signal 162, PWM signal 180, and PWM signal 184. Flow 401 then proceeds to block 416, where I functions I1, I2, I3, I4 are calculated for the left half-cycle. The I functions (shown in equations 11–14), are functions of the $f$ functions for the left half-cycle, adaptive coefficients 145, and the previous I functions for the left half-cycle. Flow 401 then continues to block 420, where estimated error 176 is estimated using the I functions and gain constants C1, C2, C3, and C4. Flow 401 then proceeds to block 424, where digital signal 106 is summed with estimated error 176. Flow 401 then proceeds to block 428, where the duty ratios for the left half-cycle are quantized to establish a quantization clock count for the left half-cycle of PWM signals 180 and 184. Flow 401 then continues to decision diamond 432, where the determination is made whether the end of the left half-cycle is complete. When the end of the left half-cycle is not complete, decision diamond 432 is repeated until the end of the left half-cycle is complete. When the end of the left half-cycle is complete, flow 401 continues to block 436, where f generator calculates $f$ functions $f1, f2, f3, f4$ for the right half-cycle of the random period generated by random period generator 130. The $f$ functions for the right half-cycle (shown in equations 7–10) are functions of digital signal 106, random period 132, delayed digital signal 162, PWM signal 180, and PWM signal 184. Flow 401 then proceeds to block 440, where I functions I1, I2, I3, I4 are calculated for the right half-cycle. The I functions for the right half-cycle (shown in equations 11–14) are functions of the $f$ functions for the right half-cycle, adaptive coefficients 145, and the previous I functions for the right half-cycle. Flow 401 then continues to block 444, where estimated error 176 is estimated using the I functions for the right half-cycle and gain constants C1, C2, C3, and C4. Flow 401 then proceeds to block 448, where digital signal 106 is summed with estimated error 176. Flow 401 then proceeds to block 452, where the duty ratios for the right half-cycle are quantized to establish a quantization clock count for the right half-cycle of PWM signals 180 and 184. Flow 401 then continues to decision diamond 456 where the determination is made whether the end of the right half-cycle is complete. When the end of the right half-cycle is not complete, decision diamond 456 is repeated until the end of the right-half cycle is complete. When the end of the right half-cycle is complete, flow 401 continues to block 404.

Figure 5:
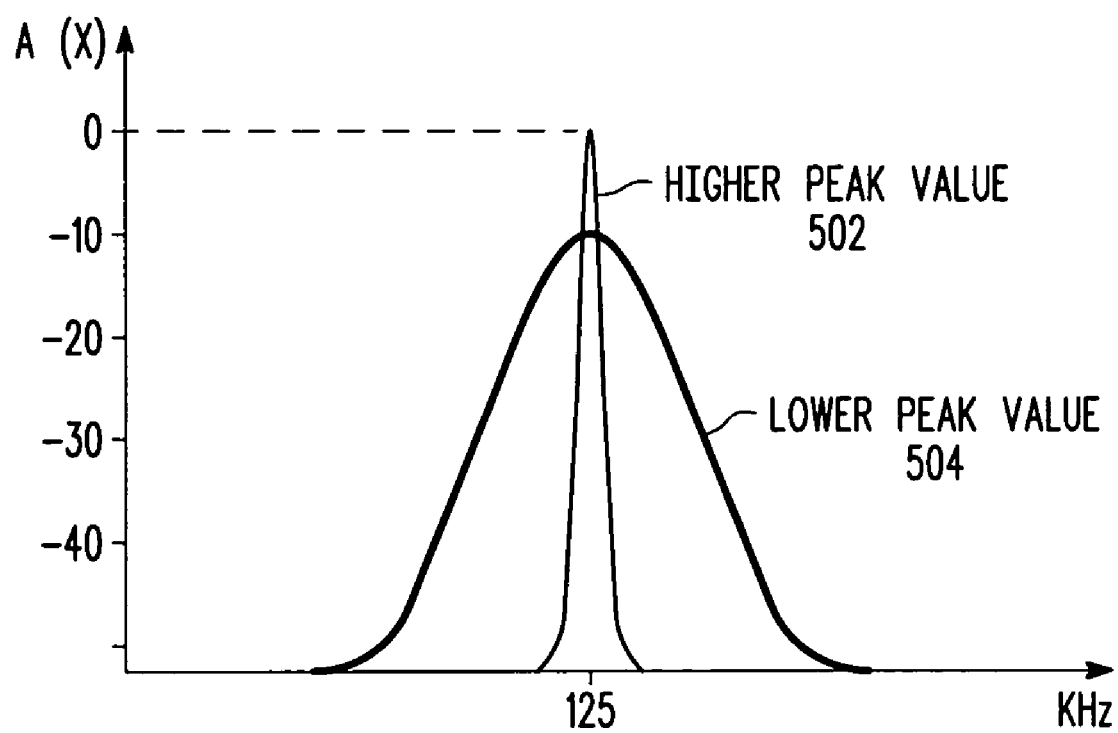
FIG. 5 illustrates the frequency spectrum of a known amplifier versus that of an amplifier in accordance with one embodiment of the present invention.

FIG. 5 illustrates a simulation using a random period generator with a random switching frequency (lower peak value 504) versus that of a fixed period generator with a fixed switching frequency (higher peak value 502). For the higher peak value 502, a large portion of the spectral content lies at 125 kHz. By using the random period generated by random period generator 130, the switching frequency noise is spread over a wide frequency spectrum (as shown by a lower peak value 504), obviating the need for a low pass filter to perform similar operations.

Figure 6:
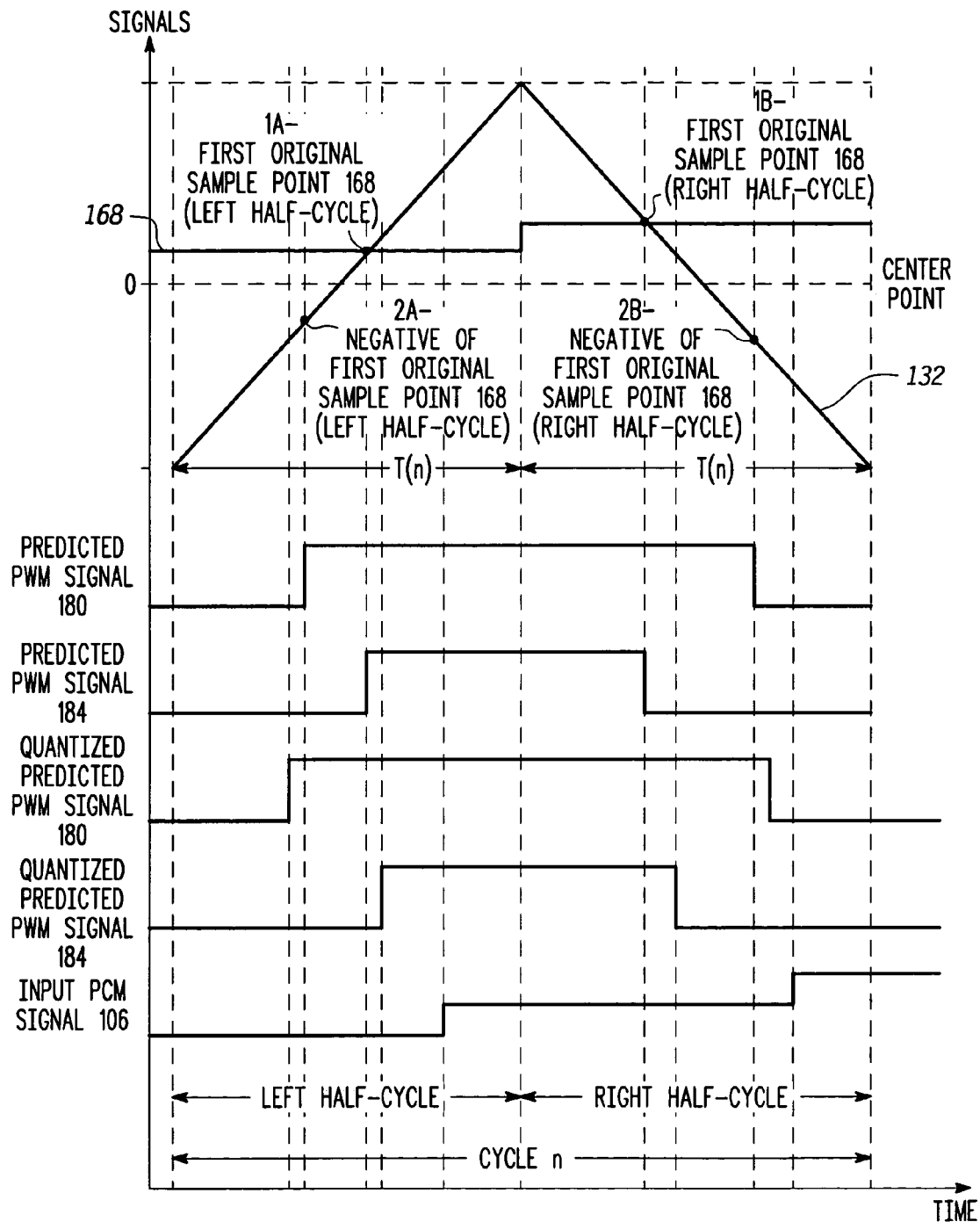
FIG. 6 illustrates, in timing diagram form, various signals associated with pulse width modulation according to one embodiment of the present invention.

FIG. 6 illustrates a time domain representation of some of the signals used and/or generated in digital amplifier 100 (shown in FIG. 1 and FIG. 2). Digital input signal 106 is a PCM signal represented as input PCM signal 106. Sample points 1A and 1B are shown as crossing points between random period signal 132, displayed as a random period triangular function, and corrected digital signal 168. Sample point 1A corresponds to a first original sample point in the left half-cycle of corrected digital signal 168. Sample point 2A corresponds to the negative (referencing center point 1 of the random period triangular function) of the first original sample point in the left half-cycle of corrected digital signal 168. Sample point 1B corresponds to a first original sample point in the right half-cycle of corrected digital signal 168. Sample point 2B corresponds to the negative of the first original sample point in the right half-cycle of corrected digital signal 168. In one embodiment, the random period of the random period triangular function has a period duration 2T[n], since both the left half-cycle and the right half-cycle have a half-period duration of T[n]. Quantized predicted PWM signal 180 represents PWM signal 180 output by PWM counter 172 and quantized PWM signal 184 represents PWM signal 184 output by PWM counter 172. Predicted PWM signal 180 and predicted signal 184 show the non-quantized versions of PWM signal 180 and PWM signal 184, respectively.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An apparatus for generating a digital pulse width modulation (PWM) signal, comprising:
   a random period signal generator for generating a random period signal;
   a noise shaping unit responsive to at least a digital signal, the random period signal, and a delayed digital signal for generating a corrected digital signal;
   a duty ratio quantizer, responsive to the corrected digital signal, the random period signal, and a quantization clock signal, for generating a first duty ratio signal and a second duty ratio signal; and
   a PWM counter, responsive to first and second duty ratio signals and a quantization clock signal, for generating positive and negative PWM signals, respectively.

2. The apparatus of claim 1, wherein the random period signal comprises an independently variable frequency signal.

3. The apparatus of claim 2, further wherein the independently variable frequency signal is variable on a cycle-by-cycle basis.

4. The apparatus of claim 1, wherein the noise shaping unit includes a delay, an adaptive coefficient generator, an integrating error amplifier, and a summer.

5. The apparatus of claim 4, further wherein the delay is responsive to the digital signal and the random period signal for generating a delayed digital signal.

6. The apparatus of claim 5, further wherein the adaptive coefficient generator is responsive to the random period signal for generating adaptive coefficients.

7. The apparatus of claim 6, wherein the integrating error amplifier performs a series of noise shaping operations to generate an estimated error signal.

8. The apparatus of claim 7, further wherein the integrating error amplifier is responsive to the adaptive coefficients, the random period signal, the delayed digital signal, the digital signal, and positive and negative PWM signals, for performing the series of noise shaping operations to generate the estimated error signal.

9. The apparatus of claim 8, wherein the estimated error signal represents noise shaped error between the delayed digital signal and a difference between the positive and negative PWM signals.

10. The apparatus of claim 9, wherein the noise shaped error between the delayed digital signal and the PWM signal difference is noise shaped by an integral portion of the integrating error amplifier using the adaptive coefficients and the digital signal.

11. The apparatus of claim 7, wherein the integrating error amplifier further derives duty ratios corresponding to a first duty ratio signal and a second duty ratio signal using the positive and negative PWM signals.

12. The apparatus of claim 7, wherein the integrating error amplifier is directly provided with a first duty ratio signal and a second duty ratio signal.

13. The apparatus of claim 7, wherein the summer is responsive to the estimated error signal and the digital signal, for performing a summation operation and for generating the corrected digital signal in response to the summation operation.

14. The apparatus of claim 1, wherein the noise shaping unit further re-distributes a quantization noise caused by the duty ratio quantizer to a band outside of an audio band of interest, as a function of the first and second duty ratio signals.

15. The apparatus of claim 1, wherein the duty ratio quantizer calculates the first and second duty ratio signals for both a left half-cycle and a right half-cycle of the random period signal.

16. The apparatus of claim 15, wherein for the left half-cycle, the duty ratio quantizer uses a first duration of a predicted quantized version of the positive and negative PWM signals and a first random half-period signal to generate the first and second duty ratio signals.

17. The apparatus of claim 16, wherein the first random half-period signal corresponds to a left half-cycle of the random period signal.

18. The apparatus of claim 17, wherein the first duration of the predicted quantized version of the positive and negative PWM signals corresponds to the corrected digital signal for the left half-cycle of random period signal.

19. The apparatus of claim 15, wherein for the right half-cycle the duty ratio quantizer uses a second duration of a predicted quantized version of the positive and negative PWM signals and a second random half-period signal to generate the first and second duty ratio signals.

20. The apparatus of claim 19, wherein the second random half-period signal corresponds to a right half-cycle of the random period signal.

21. The apparatus of claim 20, wherein the second duration of the predicted quantized version of the positive and negative PWM signals corresponds to the corrected digital signal for the right half-cycle of random period signal.

22. The apparatus of claim 1, wherein the noise shaping unit re-distributes the quantization noise caused by the duty ratio quantizer outside of an audio band of interest and for meeting a desired signal-to-noise ratio criteria at an output of a power stage.

23. The apparatus of claim 1, wherein the PWM counter generates positive and negative PWM signals by counting the number of quantization clock cycles represented by first and second duty ratio signals, respectively.

24. The apparatus of claim 23, wherein positive and negative PWM signals are in the form of square waves.

25. The apparatus of claim 1, further comprising:
 a power stage, wherein the power stage amplifies the positive and negative PWM signals to produce amplified PWM signals, respectively.

26. A method for digital pulse width modulation (PWM) signal generation, comprising:
 receiving a digital signal;
 generating a random period signal using a random period generator, the random period signal having a random period and including a left half-cycle and a right half-cycle;
 calculating adaptive coefficients based on the random period;
 using a first generator to calculate first functions for the left half-cycle of the random period;
 using a second generator to calculate second functions for the left half-cycle of the random period;
 estimating an error signal using the second functions for the left-half cycle;
 summing the digital signal with the estimated error signal for the left-half cycle;
 quantizing first and second duty ratios for the left half-cycle to establish a quantization clock count for the left half-cycle of positive and negative PWM signals;
 using the first generator to calculate first functions for the right half-cycle of the random period;
 using the second generator to calculate second functions for the right half-cycle of the random period;
 estimating an error signal using the second functions for the right half-cycle;
 summing the digital signal with the estimated error signal for the right half-cycle; and
 quantizing first and second duty ratios for the right half-cycle to establish a quantization clock count for the right half-cycle of positive and negative PWM signals.

27. The method of claim 26, wherein the first functions for the left half-cycle are functions of the digital signal, a random period, a delayed digital signal, and positive and negative PWM signals.

28. The method of claim 26, wherein the second functions for the left half-cyrcle are functions of the first functions for the left half-cycle, adaptive coefficients, and previous second functions for the left half-cycle.

29. The method of claim 26, wherein the first functions for the right half-cycle are functions of the digital signal, the random period, the delayed digital signal, and positive and negative PWM signals.

30. The method of claim 26, wherein the second functions for the right half-cycle are functions of the first functions for the right half-cycle, adaptive coefficients, and previous second functions for the right half-cycle.

31. The method of claim 26, further comprising:
 responsive to obtaining an end of the right half-cycle, repeating said method beginning with generation of a new random period signal in place of a previous random period signal.

* * * * *

UNITED STATES PATENT AND TRADEMARK OFFICE
CERTIFICATE OF CORRECTION

PATENT NO.        : 7,130,346 B2
APPLICATION NO.   : 10/845949
DATED             : October 31, 2006
INVENTOR(S)       : Pallab Midya It is certified that error appears in the above-identified patent and that said Letters Patent is hereby corrected as shown below:

In Column 8, Line 29, Claim No. 5:
Change "for generating a delayed digital signal." to --for generating the delayed digital signal.--

In Column 8, Line 52, Claim No. 11:
Change "duty ratios corresponding to a first" to --duty ratios corresponding to the first--

In Column 8, Line 53, Claim No. 11:
Change "duty ratio signal and a second duty ratio" to --duty ratio signal and the second duty ratio--

In Column 8, Line 56, Claim No. 12:
Change "amplifier is directly provided with a first duty" to --amplifier is directly provided with the first duty--

In Column 8, Line 57, Claim No. 12:
Change "and a second duty ratio signal" to --and the second duty ratio signal--

In Column 9, Line 11, Claim No. 17:
Change "half-period signal corresponds to a left" to --half-period signal corresponds to the left--

In Column 9, Line 23, Claim No. 20:
Change "half-period signal corresponds to a right" to --half-period signal corresponds to the right--

In Column 9, Line 36, Claim No. 23:
Change "the number of quantization clock cycles" to --a number of quantization clock cycles--

UNITED STATES PATENT AND TRADEMARK OFFICE
CERTIFICATE OF CORRECTION

PATENT NO. : 7,130,346 B2
APPLICATION NO. : 10/845949
DATED : October 31, 2006
INVENTOR(S) : Pallab Midya It is certified that error appears in the above-identified patent and that said Letters Patent is hereby corrected as shown below:

In Column 10, Line 31, Claim No. 28:
  Change "for the left half-cyrcle are functions" to --for the left half-cycle are functions--

Signed and Sealed this

Third Day of June, 2008

JON W. DUDAS
*Director of the United States Patent and Trademark Office*